US012312705B2

(12) United States Patent
Gershon et al.

(10) Patent No.: US 12,312,705 B2
(45) Date of Patent: May 27, 2025

(54) STABILIZATION OF METALLIC NANOWIRE MESHES VIA ENCAPSULATION

(71) Applicant: International Business Machines Corporation, Armonk, NY (US)

(72) Inventors: Talia S Gershon, White Plains, NY (US); Supratik Guha, Chicago, IL (US); Teodor K. Todorov, Yorktown Heights, NY (US); Theodore G. van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 876 days.

(21) Appl. No.: 16/391,785

(22) Filed: Apr. 23, 2019

(65) Prior Publication Data

US 2019/0249324 A1  Aug. 15, 2019

Related U.S. Application Data

(62) Division of application No. 14/841,944, filed on Sep. 1, 2015, now Pat. No. 10,309,026.

(51) Int. Cl.
*C25D 7/00*  (2006.01)
*C23C 18/12*  (2006.01)
(Continued)

(52) U.S. Cl.
CPC ............ *C25D 5/48* (2013.01); *C23C 18/1216* (2013.01); *C23C 18/1291* (2013.01);
(Continued)

(58) Field of Classification Search
None
See application file for complete search history.

(56) References Cited

U.S. PATENT DOCUMENTS 5,698,988 A * 12/1997 Motohiro ............... G01N 17/00
148/509
8,198,796 B2   6/2012 Takada
(Continued)

FOREIGN PATENT DOCUMENTS

CN   104575864 A   *  4/2015
KR    20150078225    *  7/2015  ............... H01B 1/02
(Continued)

OTHER PUBLICATIONS

WO-2009035059-A1; Translation (same as TW200923971A); Kitano; Mar. 19, 2009 (Year: 2009).*
(Continued)

*Primary Examiner* — Michael E. La Villa
(74) *Attorney, Agent, or Firm* — Jordan T. Schiller

(57) ABSTRACT

Techniques for mechanically stabilizing metallic nanowire meshes using encapsulation are provided. In one aspect, a method for forming a mechanically-stabilized metallic nanowire mesh is provided which includes the steps of: forming the metallic nanowire mesh on a substrate; and coating the metallic nanowire mesh with a metal oxide that encapsulates the metallic nanowire mesh to mechanically-stabilize the metallic nanowire mesh which permits the metallic nanowire mesh to remain conductive at temperatures greater than or equal to about 600° C. A mechanically-stabilized metallic nanowire mesh is also provided.

9 Claims, 4 Drawing Sheets

(51) Int. Cl.
- C23C 28/00 (2006.01)
- C25D 5/02 (2006.01)
- C25D 5/48 (2006.01)
- C25D 7/06 (2006.01)
- H01L 31/0224 (2006.01)
- H10F 77/20 (2025.01)

(52) U.S. Cl.
CPC .......... *C23C 28/322* (2013.01); *C23C 28/345* (2013.01); *C25D 5/02* (2013.01); *C25D 7/00* (2013.01); *C25D 7/0607* (2013.01); *H10F 77/244* (2025.01)

(56) References Cited

U.S. PATENT DOCUMENTS

| | | | |
|---|---|---|---|
| 10,309,026 | B2 | 6/2019 | Gershon |
| 2010/0140097 | A1 | 6/2010 | Wei et al. |
| 2011/0272176 | A1* | 11/2011 | Goto ............... B82Y 10/00 977/932 |
| 2012/0156458 | A1 | 6/2012 | Chu |
| 2013/0098436 | A1 | 4/2013 | Connor et al. |
| 2014/0001421 | A1 | 1/2014 | Lockett et al. |
| 2016/0010236 | A1* | 1/2016 | Rubin ............... C25D 9/06 205/83 |
| 2016/0293288 | A1* | 10/2016 | Hu ............... B32B 27/08 |

FOREIGN PATENT DOCUMENTS

| | | | | |
|---|---|---|---|---|
| KR | 20150078225 | A | 7/2015 | |
| TW | 200923971 | A | 6/2009 | |
| WO | WO-2009035059 | A1 * | 3/2009 | ............... H01B 1/22 |

OTHER PUBLICATIONS

CN-104575864-A Translation from IDS; Li Shenjiel et al ; Apr. 2015; Currently on file (Year: 2015).*

Platinum as a Reference Electrode in Electrochemical Measurements; Kasem K. Kasem* and Stephanie Jones; Platinum Metals Rev., 2008, 52, (2), 100-106 (Year: 2008).*

Merriam Webster Definition of Halogen; https://www.merriam-webster.com/dictionary/halogen (Year: 2021).*

Bib Data and Translation KR20150078225; Go Eun Byul et al; Jul. 8, 2015 (Year: 2015).*

Oja et al., "Properties of TiO2 Films Prepared by the Spray Pyrolysis Method," Solid State Phenomena, vols. 99-100, pp. 259-264 (Jul. 2004).

Parra et al., "Reaction Pathway to the Synthesis of Anatase via the Chemical Modification of Titanium Isopropoxide with Acetic Acid," Chem. Mater., 20, pp. 143-150, 2008 (published Nov. 2007).

C.H. Chung et al., "Solution-Processed Flexible Transparent Conductors Composed of Silver Nanowire Networks Embedded in Indium Tin Oxide Nanoparticle Matrices," Nano Research, vol. 5, No. 11, Nov. 2012, pp. 805-814.

P.D. Cozzoli et al., "Photocatalytic Synthesis of Silver Nanoparticles Stabilized by TiO2 Nanorods: A Semiconductor/Metal Nanocomposite in Homogeneous Nonpolar Solution." Journal of the American Chemical Society, vol. 126, No. 12, Mar. 2004, pp. 3868-3879.

H. Zhang et al., "Tuning Photoelectrochemical Performances of Ag-TiO2 Nanocomposites via Reduction/Oxidation of Ag," Chemistry of Materials, vol. 20, No. 20, Sep. 2008, pp. 6543-6549.

J. Du et al., "Controlled Synthesis of Ag/TiO2 Core-Shell Nanowires with Smooth and Bristled Surfaces via a One-Step Solution Route," Langmuir, vol. 22, No. 3, Jan. 2006, pp. 1307-1312.

P. Ramasamy et al., "Effects of TiO2 shells on optical and thermal properties of silver nanowires," Journal of Materials Chemistry, vol. 22, No. 23, May 2012, pp. 11651-11657.

I. Okada et al., "Rare-Metal-Free Flexible Counter Electrodes for Dye-Sensitized Solar-Cells Produced Using Wet Processes Only," ACS Applied Materials & Interfaces, vol. 5, No. 10, Apr. 2013, 4144-4149.

Machine translation of TW200923971 of Kitano et al., published in 2009 (20 pages).

Machine translation of CN104575864 of Pan et al., published Apr. 29, 2015 (9 pages).

Machine translation of KR20150078225 of Kim et al., published Jul. 8, 2015 (13 pages).

List of IBM Patents or Applications Treated as Related (2 pages).

* cited by examiner

STABILIZATION OF METALLIC NANOWIRE MESHES VIA ENCAPSULATION

CROSS-REFERENCE TO RELATED APPLICATION(S)

This application is a divisional of U.S. application Ser. No. 14/841,944 filed on Sep. 1, 2015, now U.S. Pat. No. 10,309,026, the disclosure of which is incorporated by reference herein.

FIELD OF THE INVENTION

The present invention relates to metallic nanowire meshes, and more particularly, to techniques for mechanically stabilizing metallic nanowire meshes against heating using encapsulation.

BACKGROUND OF THE INVENTION

Many semiconductor applications call for transparent electrodes. Common electrode materials include transparent conductors such as $In_2O_3$:Sn (ITO) and ZnO:Al (AZO). These materials can however absorb UV light and filter out wavelengths used by some devices. In addition to being transparent to UV light, for some applications the electrode also needs to be mechanically robust and not degrade at high temperatures. Very few materials exist which are both UV-transparent and mechanically stable.

Nanowire meshes offer excellent conductivity and allow reasonable transmission of light at all wavelengths. Metallic nanowires, such as silver (Ag) nanowires, are commercially available and inexpensive. Thus, metallic nanowire meshes, such as Ag nanowires meshes are a viable candidate for transparent electrode materials. However, metallic nanowires undergo microstructural changes at temperatures as low as 400° C., after which the films cease to be conductive.

Therefore metallic (e.g., Ag) nanowire meshes that are mechanically stable and remain interconnected at high temperatures would be desirable.

SUMMARY OF THE INVENTION

The present invention provides techniques for mechanically stabilizing metallic nanowire meshes using encapsulation. In one aspect of the invention, a method for forming a mechanically-stabilized metallic nanowire mesh is provided. The method includes the steps of: forming the metallic nanowire mesh on a substrate; and coating the metallic nanowire mesh with a metal oxide that encapsulates the metallic nanowire mesh to mechanically-stabilize the metallic nanowire mesh which permits the metallic nanowire mesh to remain conductive at temperatures greater than or equal to about 600° C.

In another aspect of the invention, a mechanically-stabilized metallic nanowire mesh is provided. The mechanically-stabilized metallic nanowire mesh includes: a metallic nanowire mesh on a substrate; and a metal oxide coating on the metallic nanowire mesh that encapsulates the metallic nanowire mesh to mechanically-stabilize the metallic nanowire mesh which permits the metallic nanowire mesh to remain conductive at temperatures greater than or equal to about 600° C.

In yet another aspect of the invention, another method for forming a mechanically-stabilized metallic nanowire mesh is provided. The method includes the steps of: forming the metallic nanowire mesh on a substrate; electroplating a metal onto the metallic nanowire mesh so as to fuse individual metallic nanowires in the metallic nanowire mesh together; and coating the metallic nanowire mesh with a metal oxide that encapsulates the metallic nanowire mesh to mechanically-stabilize the metallic nanowire mesh which permits the metallic nanowire mesh to remain conductive at temperatures greater than or equal to about 600° C.

A more complete understanding of the present invention, as well as further features and advantages of the present invention, will be obtained by reference to the following detailed description and drawings.

DETAILED DESCRIPTION OF PREFERRED EMBODIMENTS

As provided above, metallic nanowires meshes (such as silver (Ag) nanowire meshes) are a good option for use as a transparent electrode material since they offer excellent conductivity and allow reasonable transmission of light at all wavelengths. One drawback however with metallic nanowires meshes is that at high temperatures the nanowires undergo structural changes which render films of the material non-electrically conductive due to loss of inter-connectivity of the silver, and thus not suitable for use as an electrode. For instance, some photocatalytic or other optoelectronic devices have operating temperatures at or exceeding 600° C. This can cause the structure of metallic nanowires in a mesh to change (the nanowires essentially ball-up) and no longer provide a mesh of interconnected wires. Advantageously, provided herein are techniques for mechanically stabilizing metallic nanowires by encapsulating them with a coating of rigid material. The material used for the encapsulant—such as an oxide material, is stable and prevents the metallic nanowires from changing structurally at high operating temperatures.

Figure 1:
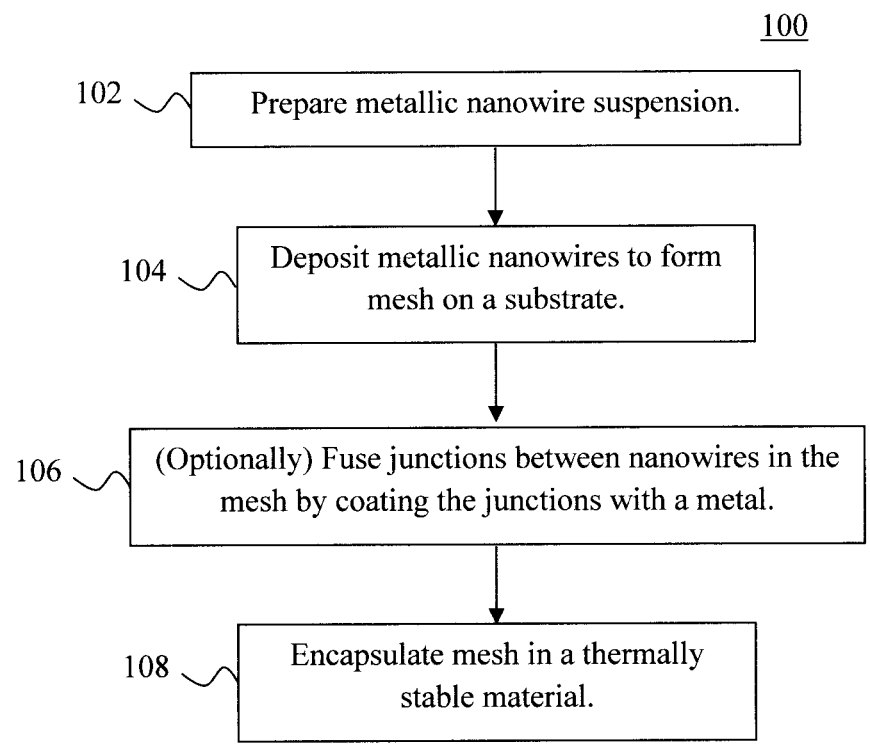
FIG. 1 is a diagram illustrating an exemplary methodology for forming a mechanically-stabilized metallic nanowire mesh according to an embodiment of the present invention.

An overview of the present techniques is now provided by way of reference to methodology 100 of FIG. 1 which provides a method for forming a mechanically-stabilized metallic nanowire mesh. In step 102, a suspension of metallic nanowires is prepared. By way of example only, the suspension is formed by dispersing the nanowires in a solvent such as water or isopropyl alcohol.

According to an exemplary embodiment, the metallic nanowires are silver nanowires. Silver nanowires are commercially available, for example, from Sigma-Aldrich®, St. Louis, MO The present techniques are however generally applicable to any type of metallic nanowire, such as silver nanowires, nickel nanowires, palladium nanowires, platinum nanowires, gold nanowires, etc.

In step 104, the nanowire suspension is then deposited onto a substrate, forming a nanowire mesh on the substrate. By way of example only, the nanowire suspension can be drop-wise applied to the surface of the substrate and permitted to dry. Once the solvent has evaporated, a mesh of the nanowires will remain on the substrate.

The term 'substrate' as used herein generally refers to any structure on which the formation of a metallic nanowire mesh is desirable. For instance, as provided above, metallic nanowire meshes are useful as transparent electrode materials. Further, in accordance with the present techniques, the metallic nanowire meshes provided herein are thermally stable. Namely, the encapsulant formed on the nanowire mesh (as described below) physically prevents the structure of the nanowires from changing during high operating temperatures. Thus, the present metallic nanowire mesh materials are ideal for use in applications requiring both conductive and thermally stable transparent electrodes. By way of example only, one such application is in a high-temperature photocatalytic device. See, for example, U.S. patent application Ser. No. 14/456,708 by Gershon et al., entitled "Techniques for Photocatalytic Hydrogen Generation," (hereinafter "U.S. patent application Ser. No. 14/456,708"), the contents of which are incorporated by reference as if fully set forth herein. In U.S. patent application Ser. No. 14/456,708 a hydrogen producing cell is described that includes an anode electrode that is transparent and can be porous (i.e., permeable to gasses). The present metallic nanowire meshes are a suitable material for use in forming the anode electrode of this hydrogen producing cell since during operation the environment within the cell can reach temperatures of (or exceeding) 600° C. Specifically, since the present metallic nanowires are thermally stabilized (via the encapsulant) one can avoid any potential issues arising from structural changes to the nanowires occurring during operation of the cell. In the worst case scenario, without structural stability, the metallic nanowires can ball-up (see example described below) destroying the continuity of the mesh and making the electrode overall non-conductive. Thus, in the case where the present techniques are being employed to form a transparent electrode on a device, such as on the hydrogen producing cell described in U.S. patent application Ser. No. 14/456,708, the term 'substrate' as used herein refers to the layer of the device on which the transparent electrode is to be formed.

Optionally, in step 106 plating can be used to fuse the junctions between the individual nanowires in the mesh. This optional plating step helps ensure connectivity between the nanowires, as well as adds rigidity and stability to the overall mesh. Specifically, as-made the metallic nanowire meshes are conductive due to the overlap between the nanowires (where the nanowires contact one another). Therefore, as per step 104, a network of interconnected nanowires is formed so that there is electrical connectivity from one end of the mesh to the other. Plating, however, actually fuses the spots together where the nanowires contact each other. With as-formed meshes, just-touching seems to give reasonable connectivity—but actually coating each of these junctions with a metal solidifies the joints where they meet and improves the rigidity and mechanical stability of the overall mesh.

According to an exemplary embodiment, the metal used to fuse the joints between the nanowires is palladium (Pd). Being a metal, palladium is a suitable choice since it can be plated and, once deposited, is electrically conductive throughout the mesh. For instance, electroplating can be used to deposit a coating of palladium onto the metallic nanowire mesh. The coating will cover over the junction between nanowires, physically fusing the nanowires together. By way of example only, a voltage/current can be applied in a standard electrochemical bath containing palladium ions, in which the metallic nanowire mesh is placed as the 'working electrode.' The palladium ions will plate onto the nanowire mesh.

In step 108, the metallic nanowire mesh (optionally with a palladium coating) is then encapsulated in a rigid, thermally stable material. According to an exemplary embodiment, the rigid, thermally stable material is a metal oxide. A metal oxide encapsulant may be formed on the metallic nanowire mesh in a number of different ways. By way of example only, with a solution-based approach a metal oxide precursor solution can be prepared and then sprayed onto the metallic nanowire mesh. Some heat may optionally be applied (e.g., a temperature of less than or equal to about 350° C.) to the sample to drive off solvent and/or form a better quality oxide material. This process results in a coating of the metal oxide on the mesh. Alternatively, the metal oxide may be deposited onto the metallic nanowire mesh by evaporation, sputtering, etc.

Suitable metal oxides include, but are not limited to, titanium oxide ($TiO_2$), tin oxide ($SnO_2$), gallium oxide ($Ga_2O_3$), and doped forms of these materials. Doping serves to increase the electrical conductivity of the metal oxides which can be advantageous when, for example, the present metallic nanowire mesh is being used as transparent electrode. $TiO_2$, $SnO_2$, and $Ga_2O_3$, can all be made conductive through doping. For instance, as is known in the art, suitable dopants for $SnO_2$ include but are not limited to, fluorine (F). Fluorine-doped $SnO_2$ is conductive, while $SnO_2$ itself acts as an insulator. Suitable dopants for $Ga_2O_3$ include but are not limited to, niobium (Nb), and suitable dopants for $TiO_2$ include but are not limited to, iron (Fe) and nickel (Ni).

In one exemplary embodiment, the metal oxide is titanium oxide. As provided above, a solution-based deposition technique is one possible way to form the metal oxide encapsulant on the metallic nanowire mesh, wherein a metal oxide precursor solution is prepared and sprayed onto the metallic nanowire mesh. According to an exemplary embodiment, the precursor solution is prepared by mixing 1 milliliter (mL) titanium isopropoxide+1 mL acetylacetonate+8 mL ethanol, and is then sprayed onto the nanowire mesh with the substrate held at a temperature of from about 150° C. to about 200° C., and ranges therebetween. Titanium isopropoxide:

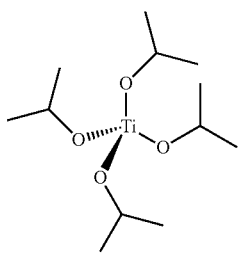

is commonly used as a precursor in titanium oxide precursor solutions. See, for example, Oja et al., "Properties of $TiO_2$ Films Prepared by the Spray Pyrolysis Method," Solid State Phenomena, vols. 99-100, pgs. 259-264 (July 2004), the contents of which are incorporated by reference as if fully set forth herein (wherein a precursor solution for spray pyrolysis of titanium oxide thin films contained titanium (IV) isopropoxide (TTIP) as a titanium source, acetylacetone (AcAc) as a stabilizer and ethanol as a solvent). See also Parra et al., "Reaction Pathway to the Synthesis of Anatase via the Chemical Modification of Titanium Isopropoxide with Acetic Acid," Chem. Mater., 20, pgs. 143-150 (2008), the contents of which are incorporated by reference as if fully set forth herein.

Metal oxides, such as titanium oxide, are thermally stable under semiconductor device operating temperatures, including the elevated temperatures encountered in a hydrogen producing cell as referenced above. Thus, during operation, when temperatures reach or exceed 600° C., the present encapsulant is surrounding the metallic nanowires and thus physically preventing the microstructure of the nanowires from changing—i.e., the encapsulant maintains the shape of the nanowires. Specifically, when elevated temperatures are encountered, the metallic nanowires tend to ball up (see, for example, FIG. 3—described below). However, if the nanowires are contained within the present encapsulant they are physically prevented from balling-up, and forced to maintain their shape.

Figure 2:
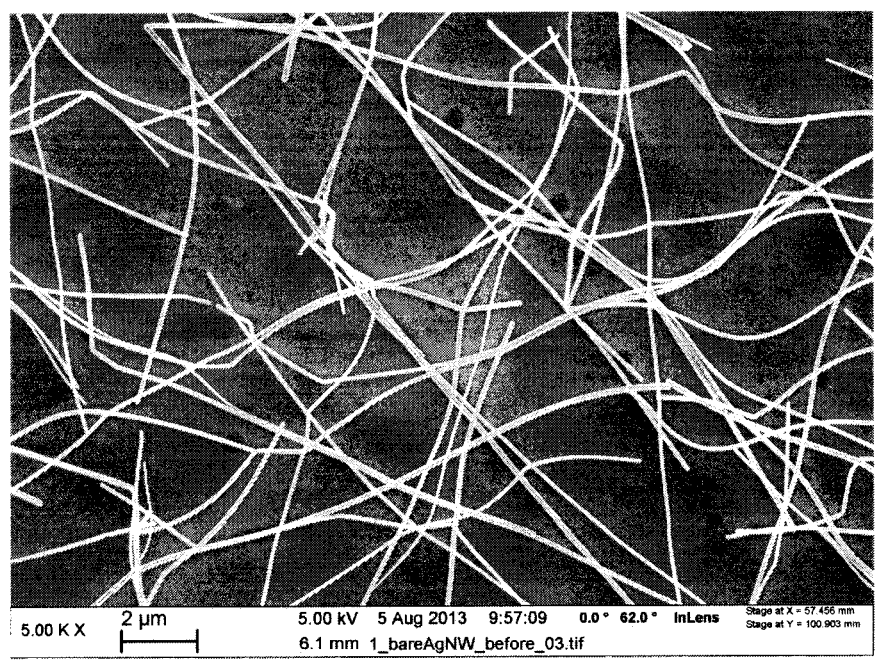
FIG. 2 is a scanning electron micrograph (SEM) image of a metallic nanowire mesh according to an embodiment of the present invention.

FIG. 2 is a scanning electron micrograph (SEM) image of a metallic (in this case silver) nanowire mesh that may be prepared, for example, in accordance with steps 102 and 104 of methodology 100 (described above). As shown in FIG. 2, in the as-formed mesh the individual nanowires are touching one another providing continuity from one end of the mesh to the other. In addition, as provided above, plating can optionally be used to fuse the junctions between the nanowires to add further mechanical stability and rigidity to the nanowire mesh.

Figure 3:
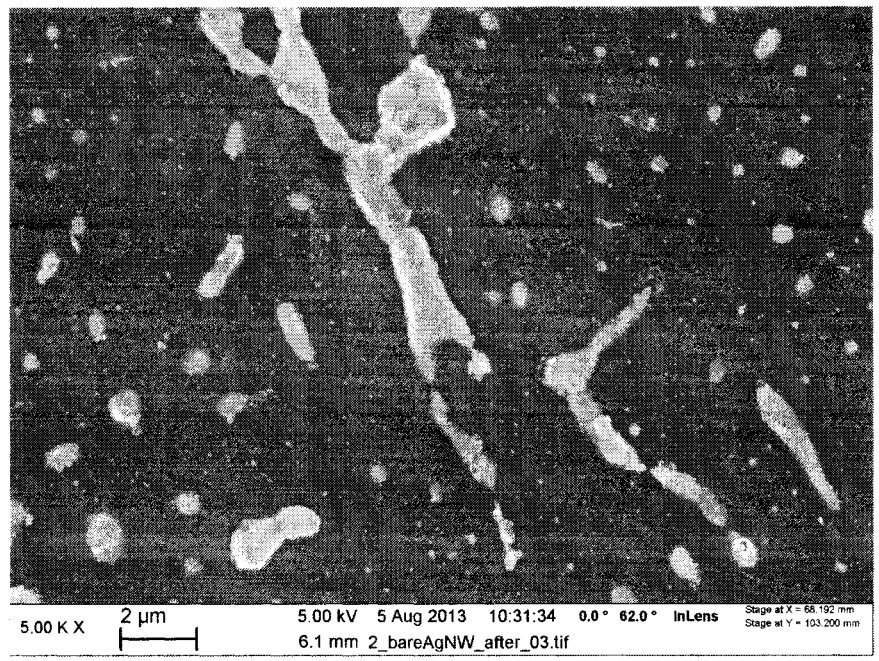
FIG. 3 is a SEM image illustrating the result of subjecting a metallic nanowire mesh to high temperatures without the present rigid encapsulant according to an embodiment of the present invention.

FIG. 3 is a SEM image of what happens to a metallic (in this case silver) nanowire mesh when it is subject to high temperatures without the present rigid encapsulant. FIG. 3 illustrates the problem solved by the present techniques. Namely, by way of comparison with the image of the nanowire mesh shown in FIG. 2, as shown in FIG. 3 when subject to high temperatures the structure of the nanowires changes (i.e., the nanowires ball-up). This structural change is permanent and, as a result, connectivity between the nanowires is lost and the film is no longer conductive. In this example, the as-formed metallic (in this case silver) nanowire mesh was heated at a temperature of 600° C. for one hour with steam (to simulate the conditions typically encountered in the above-referenced hydrogen producing cell).

Figure 4:
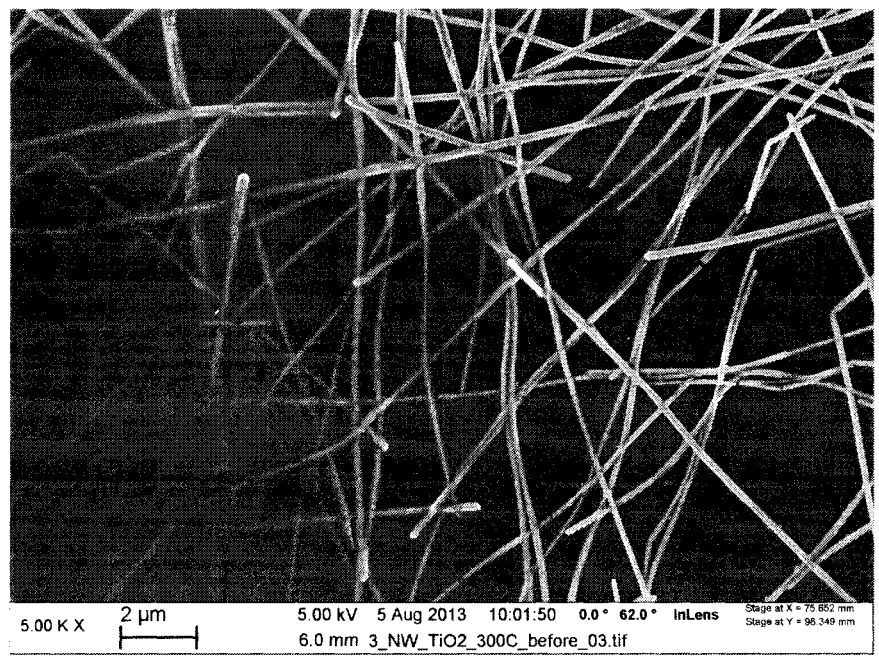
FIG. 4 is a SEM image of a metallic nanowire mesh that has been coated with the present encapsulant according to an embodiment of the present invention.
Figure 5:
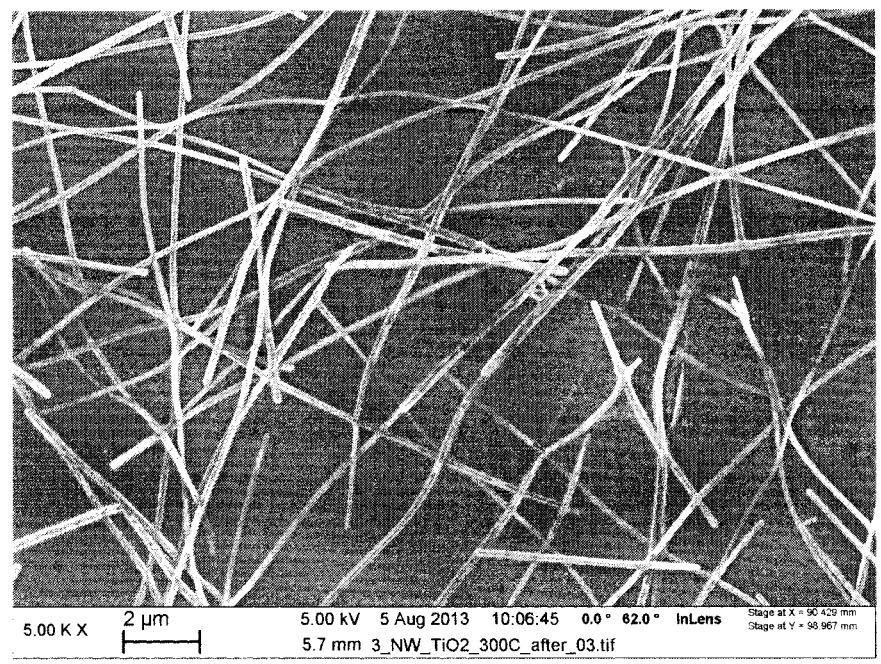
FIG. 5 is a SEM image illustrating how an encapsulated metallic nanowire mesh maintains its shape even at temperatures greater than or equal to about 600° C. according to an embodiment of the present invention.

FIG. 4 is a SEM image of a metallic (in this case silver) nanowire mesh that has been coated with the present encapsulant (in this case a titanium oxide encapsulant) using the above-described process. The mesh has the same basic as-formed configuration as shown in FIG. 2, where the nanowires in the mesh contact one another providing connectivity from one end of the mesh to the other. Thus, the process for preparing and applying the encapsulant does not change the overall arrangement of the mesh. Advantageously, as shown in FIG. 5, when the encapsulated metallic nanowire mesh is subjected to temperatures of about 600° C. for one hour with steam (the same conditions which caused the microstructural changes in the uncoated nanowires as shown in FIG. 3), the encapsulated nanowires maintain their shape. Specifically, a comparison of the images shown in FIG. 4 and in FIG. 5 reveal that the structure of the nanowire mesh has not changed despite prolonged heating at elevated temperatures. The only difference in the samples shown in FIG. 3 and in FIG. 5 is that the present encapsulant has been coated on the mesh. This demonstrates that the encapsulant is responsible for maintaining the shape of the nanowires in the mesh.

Figure 6:
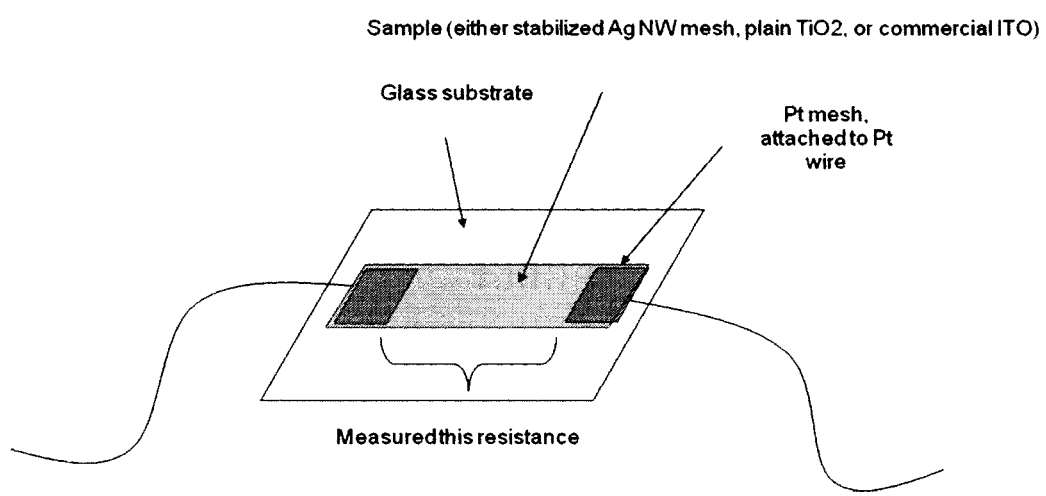
FIG. 6 is a schematic diagram of an exemplary apparatus used to test resistance of a metallic nanowire mesh sample containing the present encapsulant according to an embodiment of the present invention.

Experiments were also conducted to measure the resistance of various samples both with and without the present encapsulant in place. FIG. 6 is a schematic diagram of an exemplary apparatus used to test resistance of the samples. As shown in FIG. 6, the testing apparatus includes a glass substrate upon which each sample was placed. Platinum mesh electrodes attached to platinum wires were placed in contact with opposite ends of the sample and, after a heat treatment, resistance across each sample was measured. In this example, the samples tested included a silver nanowire mesh stabilized with the present encapsulant (see, for example, FIG. 4), plain titanium oxide (with no nanowires), and a commercial transparent electrode material—ITO. All samples were prepared as thin films on glass substrates. The titanium oxide sample was included in order to show that it is the encapsulated nanowires themselves (rather than the encapsulant) that remain conductive after the high temperature heat treatment.

A separate testing apparatus was used for each sample. Each testing apparatus with its respective sample was placed in a furnace with steam, and the resistance of the sample was measured as a function of temperature.

Figure 7:
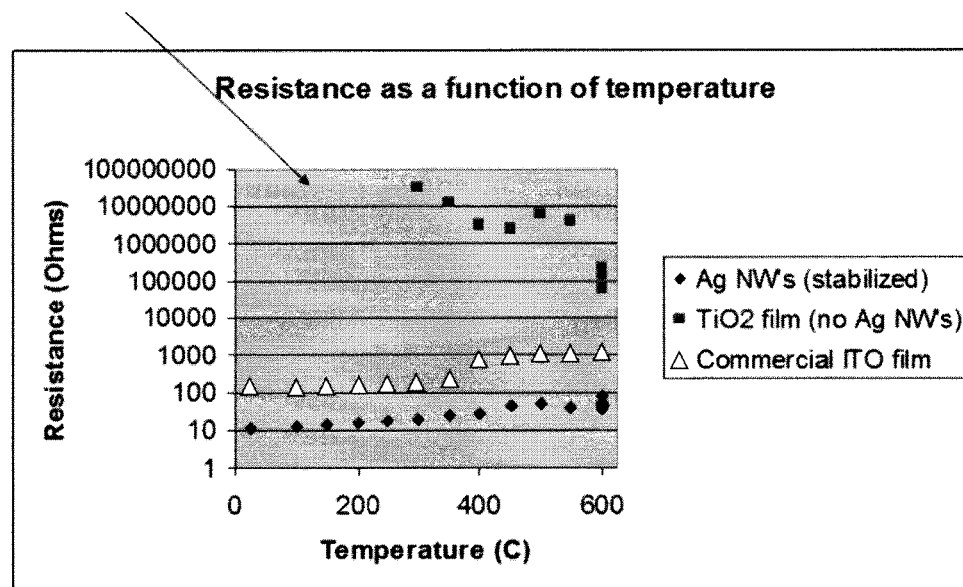
FIG. 7 is a diagram illustrating resistance as a function of temperature for the present encapsulated metallic nanowire mesh, a sample of the encapsulant without nanowires, and a conventional transparent electrode material according to an embodiment of the present invention.

The results of the resistance tests are shown in FIG. 7. FIG. 7 is a diagram illustrating resistance of the samples as a function of temperature (T). In FIG. 7, temperature (measured in ° C.) is plotted on the x-axis and resistance (measured in Ohms) is plotted on the y-axis. As the plot in FIG. 7 illustrates, the resistance of the nanowire mesh with the present encapsulant changed only slightly as temperatures of from about 400° C. to about 600° C. were reached. This trend is similar to what happened with the commercial ITO sample. The resistance of the titanium oxide sample (without any nanowires) was too high to measure at room temperature, and decreased only slightly at the elevated temperatures. This illustrates that the conductivity of the encapsulated nanowires mesh sample detected after the heating is due to the nanowires themselves, not the metal oxide (in this case titanium oxide) encapsulant. Namely, this shows that, by way of the encapsulant, the shape of the nanowires is maintained throughout the heating process thereby maintaining the integrity of the mesh. To look at it in another way, this result proves that the nanowires are not balling-up within the encapsulant, because in that case based on the resistance of the encapsulant the resistance of the sample would be very high.

Based on this sample testing, it can be concluded that the present encapsulated metallic nanowire mesh remains conductive at temperatures greater than or equal to 600° C., and that the microstructure of the encapsulated nanowires does not degrade after one hour in steam at 600° C. By comparison, the resistance of a similar metallic mesh nanowire but without encapsulation would reach infinity at such high temperatures due to the overall loss of conductivity resulting from changes in the nanowire structure and breakdown of the mesh. The above examples also show that the present encapsulated/stabilized metallic nanowire mesh is at least as conductive as commercial ITO at all temperatures tested.

As provided above, the present metallic nanowire meshes can be further mechanically stabilized through the use of metal plating which serves to fuse the junctions between the nanowires. As described above, this optional plating step can be carried out by plating the whole mesh with a metal such as palladium, prior to placing the encapsulant. By fusing the nanowires together, their connectivity is increased and the mesh is made overall more rigid and robust.

Figure 8:
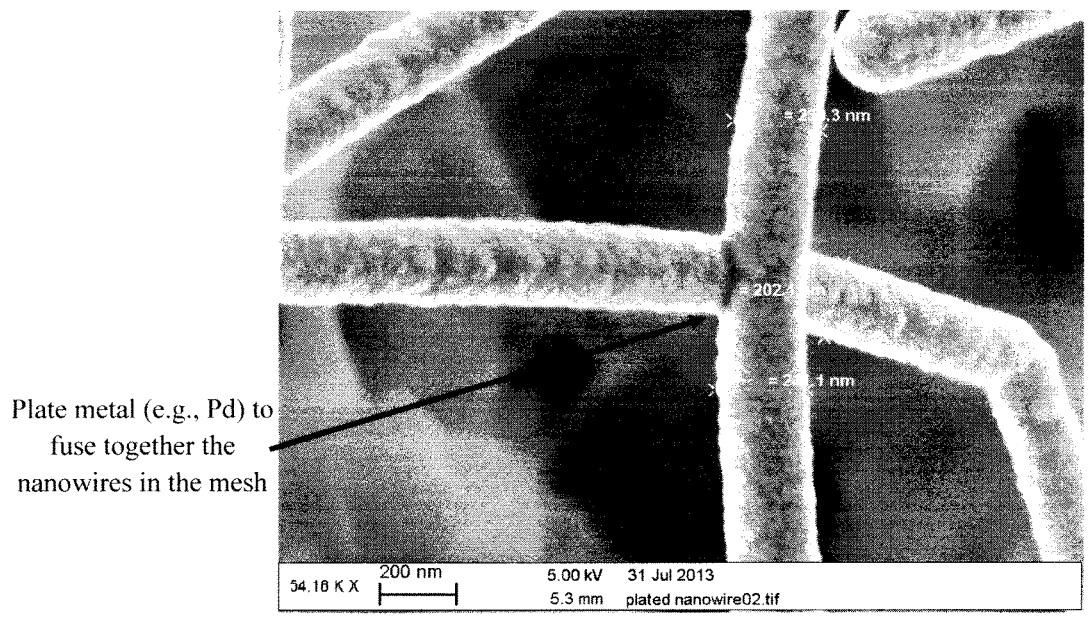
FIG. 8 is a SEM image of a sample of the present metallic nanowire mesh wherein palladium plating has been used to coat and fuse the nanowires in the mesh according to an embodiment of the present invention.

FIG. 8 is a SEM image of a sample of the present metallic nanowire mesh wherein palladium plating has been used to coat and fuse the nanowires in the mesh. Specifically, the nanowires shown perpendicular to one another in the center of FIG. 8 have been fused together by way of the palladium coating plated on to the mesh. By fusing the nanowires together, the overall rigidity of the mesh is increased. Specifically, in an as-formed mesh if these two nanowires were in contact, but not fused to one another, then the mesh would be less rigid. However, by way of the plating process, a network is formed where the nanowires are physically anchored to one another.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A mechanically-stabilized metallic nanowire mesh, comprising:
    a metallic nanowire mesh on a substrate, wherein the entire metallic nanowire mesh is first plated with palladium to further fuse the metallic nanowire mesh together and increase connectivity, and comprises a network of interconnected metallic nanowires that contact one another at junctions such that there is electrical conductivity from one end to another of the metallic nanowire mesh, and wherein plating fuses the junctions together where the nanowires contact one another; and
    a metal oxide coating on the metallic nanowire mesh that encapsulates the metallic nanowire mesh to improve rigidity and mechanically-stabilize the metallic nanowire mesh which permits the metallic nanowire mesh to remain conductive at temperatures greater than or equal to about 600° C., and have a resistance of less than 100 Ohms at temperatures above 400° C., wherein the metal oxide is doped with a dopant selected from the group consisting of: niobium, iron, and nickel to increase an electrical conductivity of the metal oxide.

2. The mechanically-stabilized metallic nanowire mesh of claim 1, wherein the metallic nanowire mesh comprises silver, nickel, palladium, platinum, or gold nanowires.

3. The mechanically-stabilized metallic nanowire mesh of claim 1, wherein the metal oxide comprises a material selected from the group consisting of: titanium oxide, tin oxide, and gallium oxide, and doped forms thereof.

4. The mechanically-stabilized metallic nanowire mesh of claim 1, wherein the metal oxide comprises titanium oxide.

5. The mechanically-stabilized metallic nanowire mesh of claim 1, wherein the metal oxide comprises gallium oxide and the dopant comprises niobium.

6. The mechanically-stabilized metallic nanowire mesh of claim 1, wherein the metal oxide comprises titanium oxide and the dopant comprises iron.

7. The mechanically-stabilized metallic nanowire mesh of claim 1, wherein the metal oxide comprises titanium oxide and the dopant comprises nickel.

8. The mechanically-stabilized metallic nanowire mesh of claim 1, further comprising:
    electrodes in contact with opposite ends of the metallic nanowire mesh coated with the metal oxide.

9. The mechanically-stabilized metallic nanowire mesh of claim 8, wherein the electrodes comprise a platinum mesh.

* * * * *